(12) United States Patent
Kono

(10) Patent No.: US 8,144,500 B2
(45) Date of Patent: Mar. 27, 2012

(54) SEMICONDUCTOR MEMORY DEVICE

(75) Inventor: Fumihiro Kono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 12/876,746

(22) Filed: Sep. 7, 2010

(65) Prior Publication Data

US 2011/0141793 A1   Jun. 16, 2011

(30) Foreign Application Priority Data

Dec. 14, 2009 (JP) ................................ 2009-283315

(51) Int. Cl.
*G11C 11/00* (2006.01)
(52) U.S. Cl. ...................... 365/148; 365/163; 365/210.1
(58) Field of Classification Search .................. 365/148, 365/163, 210.1, 63
See application file for complete search history.

(56) References Cited

U.S. PATENT DOCUMENTS

| 5,793,695 | A | 8/1998 | Kohno | |
|---|---|---|---|---|
| 8,031,508 | B2 * | 10/2011 | Toda et al. | 365/148 |
| 2009/0003047 | A1 * | 1/2009 | Toda | 365/163 |
| 2010/0046275 | A1 | 2/2010 | Hosono et al. | |

FOREIGN PATENT DOCUMENTS

JP   2009-9657   1/2009

OTHER PUBLICATIONS

U.S. Appl. No. 13/018,832, filed Feb. 1, 2011, Kono.
U.S. Appl. No. 13/043,736, filed Mar. 9, 2011, Kono.

* cited by examiner

*Primary Examiner* — Huan Hoang
(74) *Attorney, Agent, or Firm* — Oblon, Spivak, McClelland, Maier & Neustadt, L.L.P.

(57) ABSTRACT

According to one embodiment, semiconductor memory device includes: semiconductor substrate; parallel first lines stacked on substrate; parallel second lines intersecting first lines; memory cell array including memory cells at intersections of first and second lines and each including variable resistance element and selecting element series-connected together; first control circuit provided in second region of substrate adjoining first region immediately under array; second control circuit provided in first region of substrate; and dummy lines formed in same layer as second lines, such that they intersect first lines in region above first control circuit. First control circuit applies first voltage to selected first line. Second control circuit applies second voltage lower than first voltage to selected second line, and to dummy lines, third voltage by which potential difference applied to memory cells at intersections of selected first line and dummy lines becomes lower than on-voltage of selecting element.

20 Claims, 7 Drawing Sheets

"BL Layer"

"WL Layer"

"BL Layer"

"WL Layer"

SEMICONDUCTOR MEMORY DEVICE

CROSS REFERENCE TO RELATED APPLICATIONS

This application is based upon and claims the benefit of priority from prior Japanese Patent Application No. 2009-283315, filed on Dec. 14, 2009, the entire contents of which are incorporated herein by reference.

BACKGROUND

1. Field

Embodiments described herein relate generally to a semiconductor memory device.

2. Description of the Related Art

In recent years, resistance varying memories using a variable resistance element as a memory element are attracting attention as a candidate to succeed flash memories. Resistance varying memories include: a resistance varying memory in the narrowly-defined meaning (ReRAM: Resistive RAM), which stores, in a nonvolatile manner, a resistance state of its recording layer made of a transition metal oxide; a phase change memory (PCRAM: Phase Change RAM) which uses chalcogenide, etc. as its recording layer and utilizes the resistance information of the chalcogenide in its crystalline state (conductive) and its amorphous state (insulative), etc.

It is known that memory cells of the resistance varying memories have two types of operation modes. One is called bipolar type which sets a high resistance state and a low resistance state by switching the polarities of voltages to apply. The other is called unipolar type which enables to set a high resistance state and a low resistance state not by switching the polarities of voltages to apply but by controlling voltage values and voltage application times.

The unipolar type is preferred in order to realize a high-density memory cell array, because when the unipolar type is used, it is possible to configure a cell array not by using a transistor but by stacking a variable resistance element and a rectifying element such as a diode, etc. at the intersections of bit lines and word lines. Furthermore, by stacking such memory cell arrays three-dimensionally, it is possible to realize a large memory capacity without increasing the cell array area.

When assembling a three-dimensional memory cell array in a resistance varying memory, bit lines are formed in plural layers in the stacking direction, and word lines are formed in plural layers in the stacking direction such that the word lines intersect the bit lines. The memory cell array is formed with memory cells formed three-dimensionally at the intersections of the bit lines and the word lines. Control circuits for controlling the voltages of the bit lines and the word lines are formed on a semiconductor substrate under the memory cell array. The issue of the device having the above configuration is to form a wiring configuration with accuracy and supply desired voltages to the memory cells.

DETAILED DESCRIPTION

A semiconductor memory device according to one embodiment includes a semiconductor substrate, a plurality of first lines, a plurality of second lines, a memory cell array, a first control circuit, a second control circuit, and dummy lines. The first lines are stacked on the semiconductor substrate and parallel with one another. The second lines are formed to intersect the plurality of first lines and parallel with one another. The memory cell array includes memory cells provided at the intersections of the first lines and the second lines and each including a variable resistance element and a selecting element connected in series to the variable resistance element. The first control circuit is provided on a portion of the semiconductor substrate that is in a second region adjoining a first region located immediately under the memory cell array, and connected to ends of the first lines to select and drive the first lines. The second control circuit is provided on a portion of the semiconductor substrate that is in the first region, and connected to ends of the second lines to select and drive the second lines. The dummy lines are formed in the same wiring layer in which the second lines are formed, such that the dummy lines intersect the first lines in a region above the first control circuit. The first control circuit applies a first voltage to a selected one of the first lines such that a certain potential difference is applied to a selected memory cell provided at the intersection of the selected first line and a selected one of the second lines. The second control circuit applies a second voltage having a smaller voltage value than that of the first voltage to the selected second line, and applies, to the dummy lines, a third voltage having such a voltage value by which a potential difference to be applied to the memory cells provided at the intersections of the selected and driven first line and the dummy lines becomes lower than an on-voltage of the selecting element.

A semiconductor memory device according to the embodiments of the present invention will now be explained with reference to the drawings.

First Embodiment

Configuration of Semiconductor Memory Device According to First Embodiment

Figure 1:
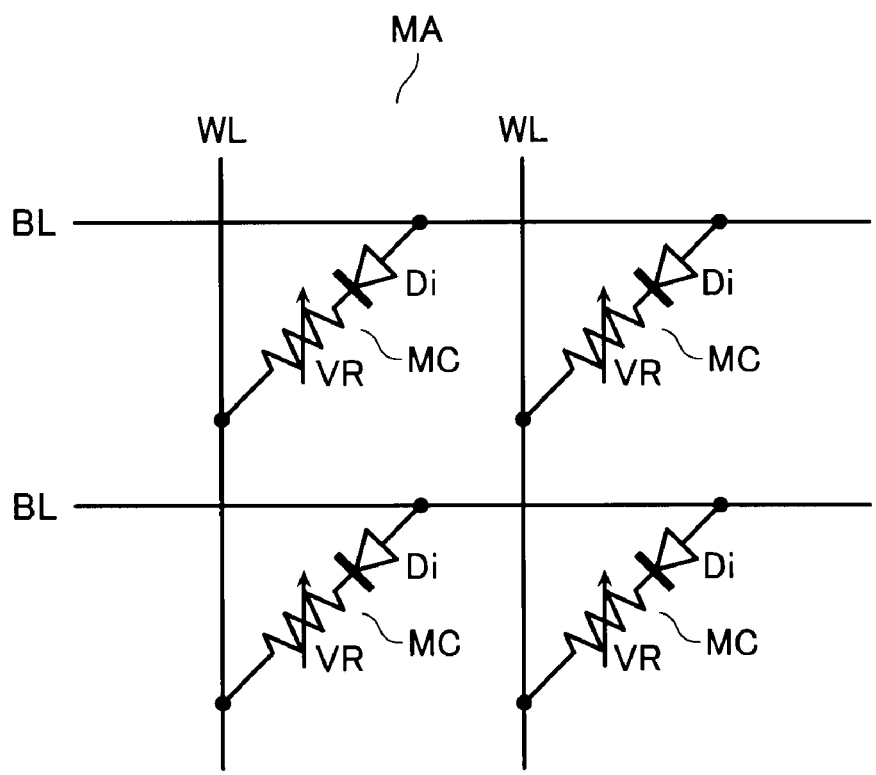
FIG. 1 is an equivalent circuit diagram showing a part of a memory cell array of a semiconductor memory device according to a first embodiment.
Figure 2:
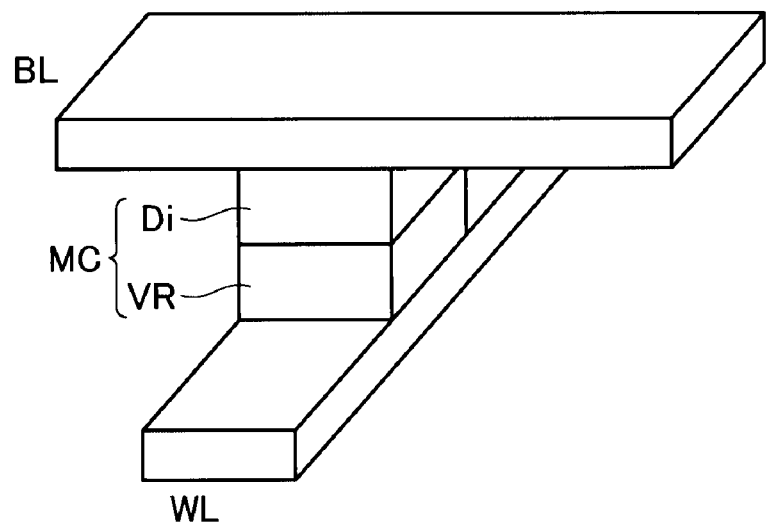
FIG. 2 is a perspective diagram showing a part of the memory cell array of the semiconductor memory device according to the first embodiment.

FIG. 1 and FIG. 2 are an equivalent circuit diagram and a perspective diagram showing a memory cell array of a semiconductor memory device according to an embodiment of the present invention. The semiconductor memory device includes a plurality of word lines WL provided in parallel with one another, and a plurality of bit lines BL intersecting the word lines WL and provided in parallel with one another. Memory cells MC are provided at the intersections of the word lines WL and the bit lines BL such that one end of each memory cell is connected to the bit line BL and the other end thereof is connected to the word line WL. The bit lines BL, the word lines WL, and the memory cells MC configure a memory cell array MA.

FIG. 2 is a perspective diagram showing a part of the memory cell array MA shown in FIG. 1. In the memory cell array MA, the memory cells MC are provided at the intersections of the word lines WL and the bit lines BL provided to intersect the word lines WL. The memory cells MC are of a unipolar type configured by a variable resistance element VR which transitions between at least two resistance states of low resistance state and high resistance state, and a selecting element formed of a non-ohmic element such as a diode Di. However, the present invention is not limited to memory cells MC of a unipolar type, but can also be applied to a semiconductor memory device including memory cells MC of a bipolar type. In the present embodiment, the diode Di is connected in such a polarity that one end thereof that is closer to the word line WL is a cathode. However, it is also possible to implement an embodiment in which, conversely, the anode of the diode Di is placed toward the word line WL.

The semiconductor memory device according to the present embodiment shown in FIG. 1 and FIG. 2 has a so-called cross-point configuration. In the cross-point configuration, the word lines WL and the bit lines BL are mere line-and-space patterns, and the word lines WL and the bit lines BL need only to orthogonally intersect each other. Therefore, there is no need of considering misalignment in the direction along the word lines WL and in the direction along the bit lines BL. Accordingly, in the manufacturing process, the memory cell array MA can be easily manufactured with a loose demand for positional accuracy in the array.

The variable resistance element VR may be an element (PCRAM) which varies its resistance by phase change between a crystal state and an amorphous state as observed in chalcogenide, etc., an element (CBRAM) which varies its resistance by forming a bridge (a conductive bridge) between electrodes by precipitating metal cations and destroying the bridge by ionizing the precipitated metal, an element (ReRAM) which varies its resistance upon voltage or current application (ReRAM is roughly divided into a type which varies its resistance according to presence or absence of charges trapped in a charge trap existing at an electrode interface and a type which varies its resistance according to presence or absence of a conducting path due to oxygen loss, etc.), etc. Particularly in the case of ReRAM, $ZnMn_2O_4$, NiO, $TiO_2$, $SrZrO_3$, $Pr_{0.7}Ca_{0.3}MnO_3$, etc. can be used.

In the case of a unipolar-type ReRAM, write of data into a memory cell MC is executed by applying a certain voltage to the variable resistance element VR for a short time. As a result, the variable resistance element VR changes from a high resistance state to a low resistance state. Hereinafter, this operation of changing the variable resistance element VR from a high resistance state to a low resistance state will be referred to as set operation. On the other hand, erase of data from a memory cell MC is executed by applying a certain voltage lower than the voltage in the set operation for a long time to the variable resistance element VR having undergone the set operation and hence currently existing in a low resistance state. As a result, the variable resistance element VR changes from a low resistance state to a high resistance state. Hereinafter, this operation of changing the variable resistance element VR from a low resistance state to a high resistance state will be referred to as reset operation. A memory cell MC is defined as being in a stable state (a reset state) when, for example, it is in a high resistance state. When a memory cell MC is configured to store binary data, data is written into the memory cell MC by a set operation of changing the memory cell from the stable reset state to a low resistance state. A read operation of a memory cell MC is executed by supplying a certain voltage to the variable resistance element VR and monitoring a current to flow through the variable resistance element VR by a sense amplifier. By this operation, it is determined whether the variable resistance element VR is in a low resistance state or in a high resistance state.

Figure 3:
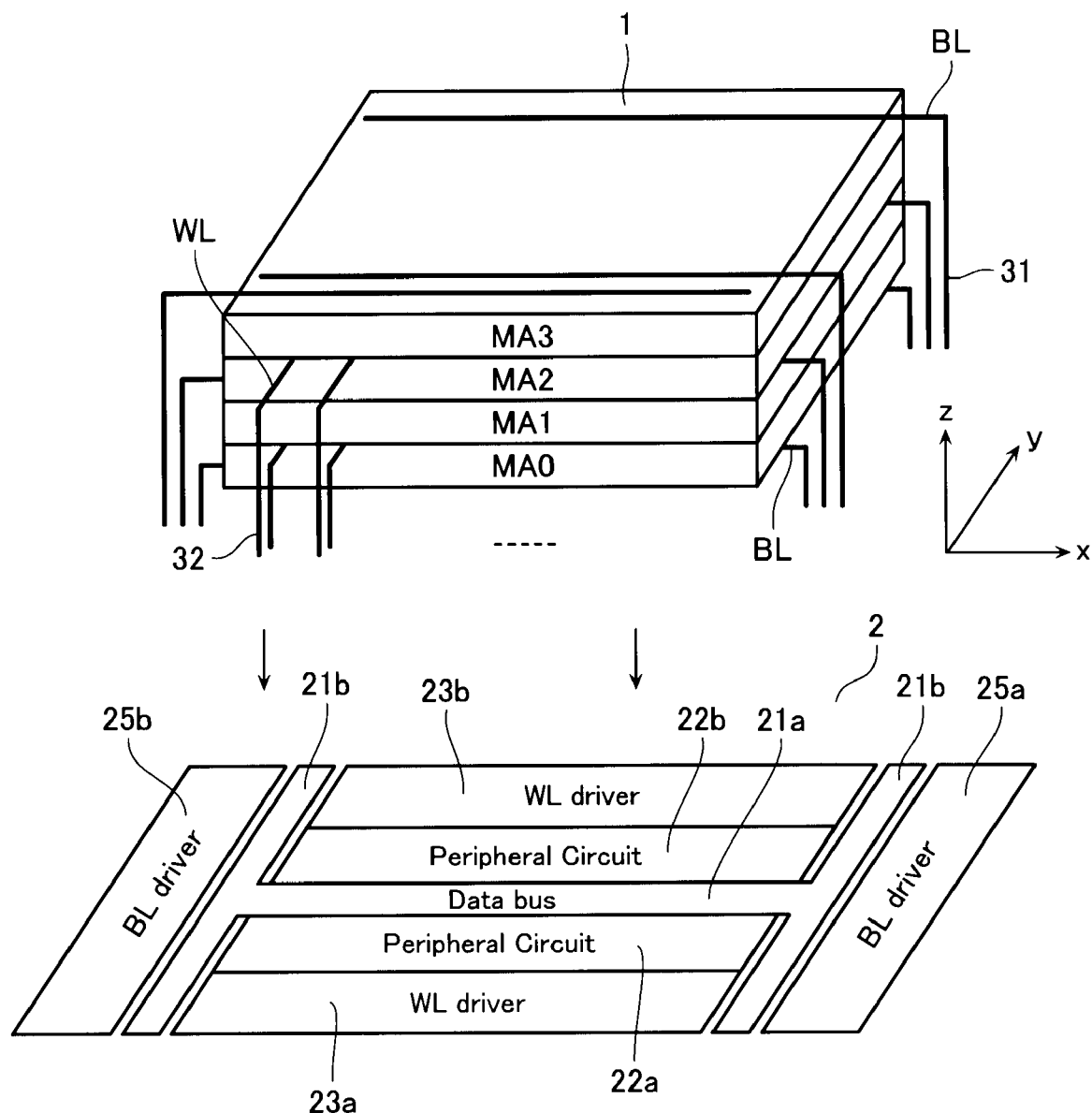
FIG. 3 is a perspective diagram of a memory block and control circuits of the semiconductor memory device according to the first embodiment.

FIG. 3 is an exploded perspective diagram of a memory block 1 and control circuits formed on a semiconductor substrate 2 and used for read/write, which are included in the semiconductor memory device according to the present embodiment. Here, only one memory block 1 is shown, but actually such memory blocks 1 are arranged in a matrix formation.

The memory block 1 has a three-dimensional configuration in which, for example, memory cell arrays MA0 to MA3 are stacked in four layers. As described above, the memory cell array MAn (n=0 to 3) in each layer is configured with memory cells MC provided at the intersections of bit lines BL extending in an x-direction parallel with the semiconductor substrate and word lines WL extending in a y-direction to intersect the bit lines BL. In the memory block 1 of FIG. 3, two layers adjoining in the stacking direction (z-direction of FIG. 3) share bit lines BL or word lines WL. That is, the first memory cell array MA0 and the second memory cell array MA1 share word lines WL, and the third memory cell array MA2 and the fourth memory cell array MA3 share word lines WL. The second memory cell array MA1 and the third memory cell array MA2 share bit lines BL. Since the first memory cell array MA0 and the fourth memory cell array MA3 have no memory cell array MA to make a pair for sharing, the bit lines BL of these arrays are used for only one memory cell array MA.

Control circuits used for read/write are formed on the semiconductor substrate 2 under the memory block 1. Formed on the semiconductor substrate 2 are two lines of word line drivers 23a and 23b, which have their longer sides corresponding to the two sides of the memory block 1 extending in the x-direction. The word line drivers 23a and 23b are formed on a portion of the semiconductor substrate 2 that is in a region (first region) immediately below the memory block 1. Ends of the word lines WL of the memory block 1 are led out by vertical via contacts 32 and connected to the word line drivers 23a and 23b.

Also formed on the semiconductor substrate 2 are two lines of bit line drivers 25a and 25b, which have their longer sides corresponding to the two sides of the memory block 1 extending in the y-direction. Since the word line drivers 23a and 23b are formed in the region (first region) immediately under the memory block 1, the bit line drivers 25a and 25b are formed on a portion of the semiconductor substrate 2 that is in a region (second region) adjoining the first region immediately under the memory block 1. Ends of the bit lines BL are led out by vertical via contacts 31 and connected to the bit line drivers 25a and 25b.

Other peripheral circuits 22a and 22b necessary for the operation of the semiconductor memory device, such as a decoder, a sense amplifier, etc. are formed in the region immediately under the memory block 1. The control circuits formed on the semiconductor substrate 2 are externally connected through data buses 21*a* and 21*b* such that the operations thereof are controlled. A selected bit line address and a selected word line address are supplied to the bit line drivers 25*a* and 25*b* and to the word line drivers 23*a* and 23*b* respectively through the data buses 21*a* and 21*b*. Then, a certain combination of voltages corresponding to each of read, write, and erase operations are applied to the selected bit line BL and the selected word line WL via the bit line drivers 25*a* and 25*b* and the word line drivers 23*a* and 23*b*.

Figure 4:
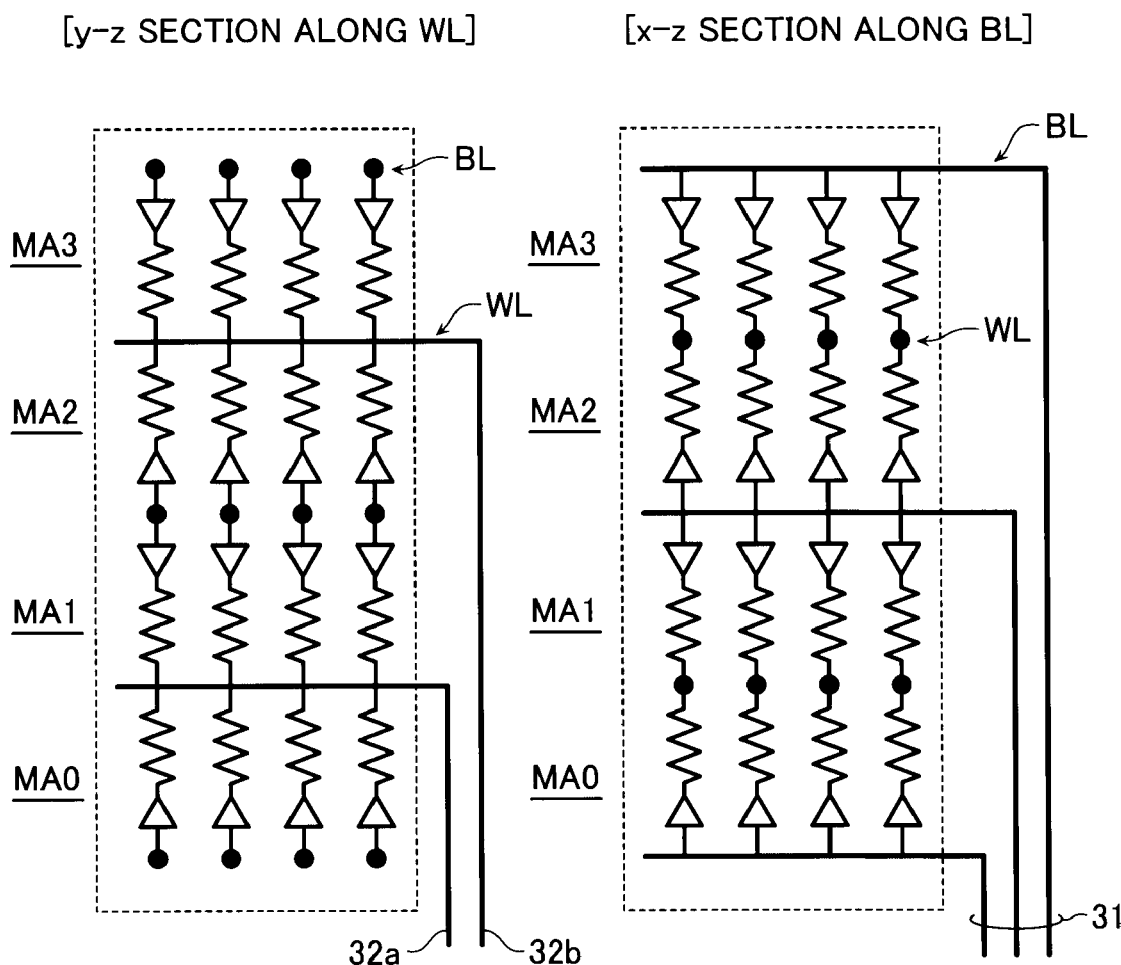
FIG. 4 shows sectional diagrams of the memory block of the semiconductor memory device according to the first embodiment.

When upper and lower memory cell arrays MA share bit lines BL and word lines WL as described above, the arrangement of the via contacts of the bit lines BL and the word lines WL needs to be formed as follows. FIG. 4 shows a y-z section of the memory block 1 taken along the word lines WL and an x-z section of the memory block 1 taken along the bit lines BL. FIG. 4 shows example arrangement of the via contacts of the word lines WL and the bit lines BL. When the word lines WL and the bit lines BL are shared by adjoining memory cell arrays MA, the word lines WL in the respective layers lining up in the stacking direction (z-direction) are connected to the word line drivers 23*a* and 23*b* by the via contacts 32*a* and 32*b*. The bit lines BL in the respective layers lining up in the stacking direction (z-direction) need to be connected to the bit line drivers 25*a* and 25*b* by different via contacts 31 respectively.

When the number of layers of memory cell arrays MA is increased in this example via-contact arrangement, the word lines WL to line up in the stacking direction (z-direction) can be connected to the via contacts 32*a* and 32*b* alternately. That is, the word lines WL to be formed in the next upper layer can be connected to the word line drivers 23 by the via contacts 32*a*, and the word lines WL to be formed in the still next upper layer can be connected to the word line drivers 23 by the via contacts 32*b*. This connection is possible because even with this connection, a selected memory cell MC connected to a selected bit line BL and a selected word line WL is determined uniquely. Therefore, even when the number of layers of memory cell arrays MA is increased, it is possible that the number of word line via contacts 32 remain two.

However, it is necessary to provide different via contacts 31 for the bit lines BL respectively. Therefore, as the number of layers of memory cell arrays MA is increased, the number of via contacts 31 for the bit lines BL is increased. Though the memory block shown in FIG. 3 is configured by four memory cell arrays MA0 to MA3, as the number of memory cell arrays MA to be stacked is increased to eight layers, sixteen layers, and so on, the number of via contacts 31 necessary for the bit lines BL is increased to five, nine, and so on. Therefore, the areas of the bit line drivers 25*a* and 25*b*, which include the regions of the via contacts 31 of the bit lines BL, are also increased.

Since no memory cell array MA is formed above the regions of the bit line drivers 25*a* and 25*b*, it is inherently unnecessary to provide word lines WL in these regions. However, in a given word line layer, if word lines WL are formed in the region of the memory block 1 and no word lines WL are formed in the regions above the bit line drivers 25*a* and 25*b*, manufacturing conditions for stacking, polishing, etc. of a bit line layer to be formed on the word line layer vary between the memory cell array region and the bit line driver regions. Therefore, a problem arises that the bit line layer cannot be stacked with accuracy and the manufacture of the memory block 1 becomes difficult. In order to prevent this problem, it is necessary to provide dummy word lines in the regions above the bit line drivers 25*a* and 25*b*. If word lines WL are formed in the region of the memory block 1 and dummy word lines are formed in the same layer as these word lines WL in the regions above the bit line drivers 25*a* and 25*b*, the manufacturing conditions for the bit line layer do not vary between the memory cell array region and the bit line driver regions. The wiring layout of a semiconductor memory device in which dummy word lines are provided in the regions above the bit line drivers 25*a* and 25*b* will now be explained.

Figure 5A:
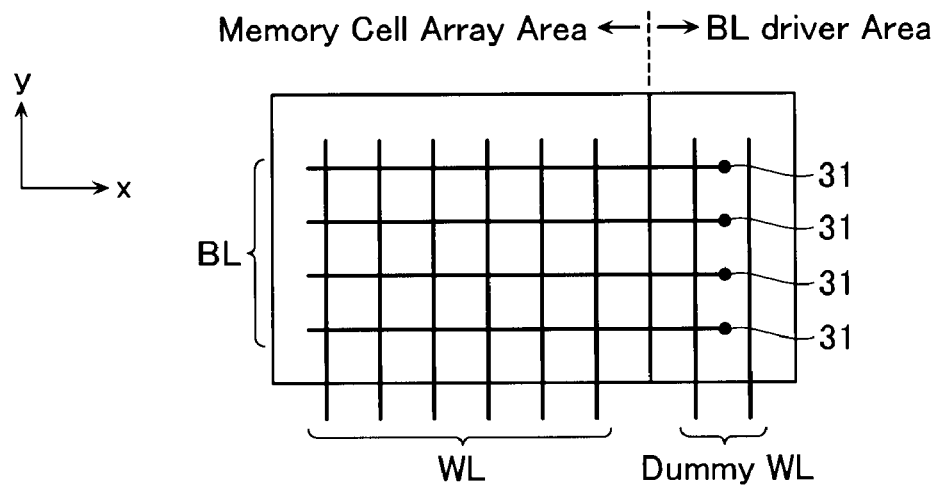
FIG. 5A is a layout diagram of wiring layers of the semiconductor memory device according to the first embodiment.
Figure 5B:
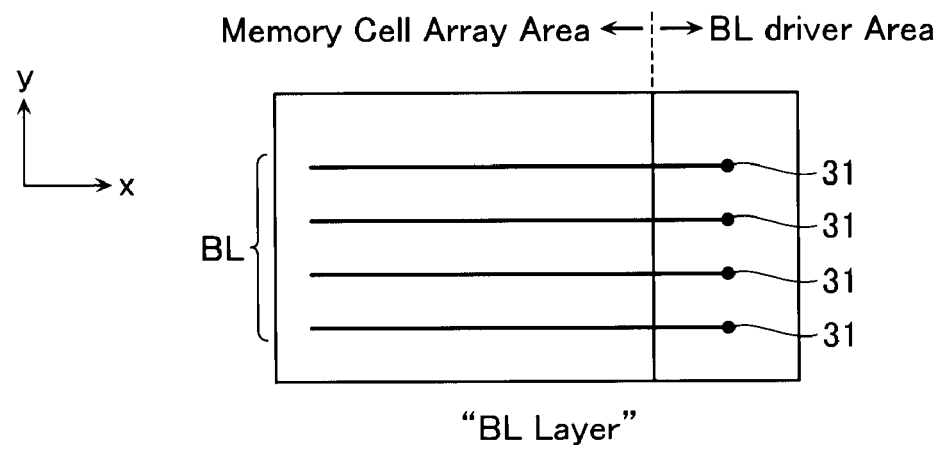
FIG. 5B is a layout diagram of a wiring layer of the semiconductor memory device according to the first embodiment.
Figure 5C:
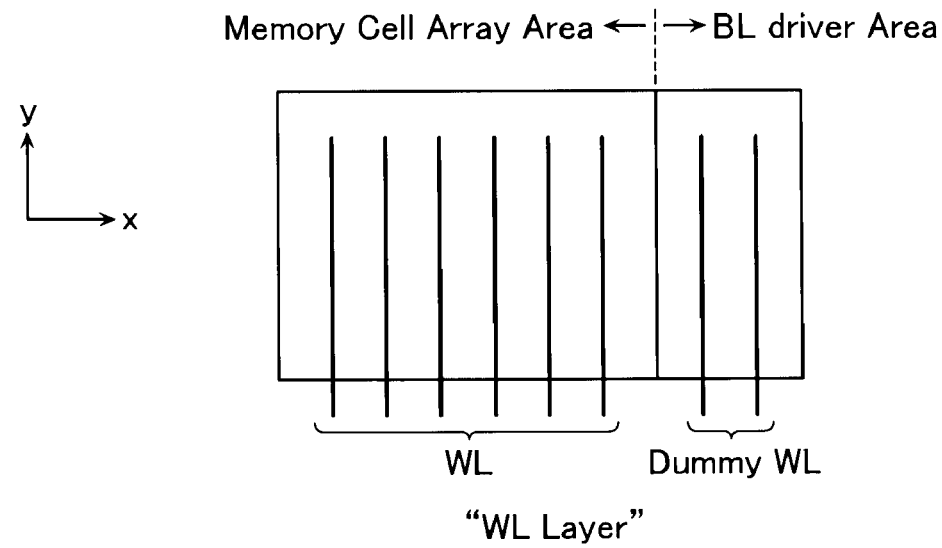
FIG. 5C is a layout diagram of a wiring layer of the semiconductor memory device according to the first embodiment.

FIG. 5A to FIG. 5C are wiring layout diagrams of a bit line layer and a word line layer of a semiconductor memory device according to the present embodiment. FIG. 5A shows the wiring layouts of a bit line layer and a word line layer in an overlaying manner. FIG. 5B and FIG. 5C show the wiring layouts of a bit line layer and a word line layer separately. FIG. 5A to FIG. 5C show, as top views, the wiring layouts in a region in which a memory cell array MA is formed by a bit line layer and a word line layer and a region above a bit line driver 25.

FIG. 5A is a wiring layout diagram of bit lines BL, word lines WL, and dummy word lines DummyWL formed in a memory cell array region and a bit line driver region. As described above, the semiconductor memory device according to the present embodiment has a cross-point type memory cell array MA in which bit lines BL and word lines WL intersect each other. Hence, in the memory cell array region, bit lines BL and word lines WL are provided to intersect each other.

As shown in FIG. 5B, in the memory cell array region, a plurality of bit lines BL extend in a direction that is parallel with the semiconductor substrate 2 (in an x-direction shown in FIG. 5A). The bit lines BL are lined up in a y-direction such that they are parallel with one another. The y-direction is parallel with the semiconductor substrate 2 and orthogonal to the x-direction. The bit lines BL extend to a certain position in the bit line driver region to be connected to via contacts 31. The bit lines BL are connected by the via contacts 31 to a bit line driver 25 provided on the semiconductor substrate 2 provided below.

As shown in FIG. 5C, in the memory cell array region, a plurality of word lines WL, which extend in the y-direction, are lined up in the x-direction such that the word lines WL are parallel with one another and intersect the bit lines BL. In the bit line driver region, a plurality of dummy word lines DummyWL, which extend in the y-direction, are provided in parallel with one another. Here, the line width of the dummy word lines DummyWL may be the same as that of the word lines WL or may be larger than that of the word lines WL.

FIG. 5A to FIG. 5C show the layout of bit lines BL, word lines WL, and dummy word lines DummyWL for forming one memory cell array MA. A memory block 1 is configured with bit line layers and word line layers stacked alternately.

In this case, in the bit line driver region, the bit lines BL and the dummy word lines DummyWL intersect each other. In the manufacturing process of the semiconductor memory device according to this embodiment, a resistance varying film as variable resistance elements and a semiconductor layer as diodes are stacked on a bit line layer and processed. Thereafter, a word line layer is formed thereon. With the layout shown in FIG. 5A to FIG. 5C in which the bit lines BL and the dummy word lines DummyWL intersect each other in the bit line driver region, the resistance varying film and the semiconductor layer to become diodes remain at the intersections. Hence, undesirably, the same configuration as a memory cell MC is formed at the intersections of the bit lines BL and the dummy word lines DummyWL. If operated with no concern for the existence of such unnecessary memory cells MC formed at the intersections of the bit lines BL and the dummy word lines DummyWL, the semiconductor memory device might operate erroneously. Hence, the semiconductor memory device according to the present embodiment employs the above wiring layout of the bit line layer and the word line layer, and at the same time, executes an operation by applying voltages also to the dummy word lines DummyWL from the word line drivers 23. An operation of the semiconductor memory device will be explained below.

[Operation of Semiconductor Memory Device According to First Embodiment]

Figure 6:
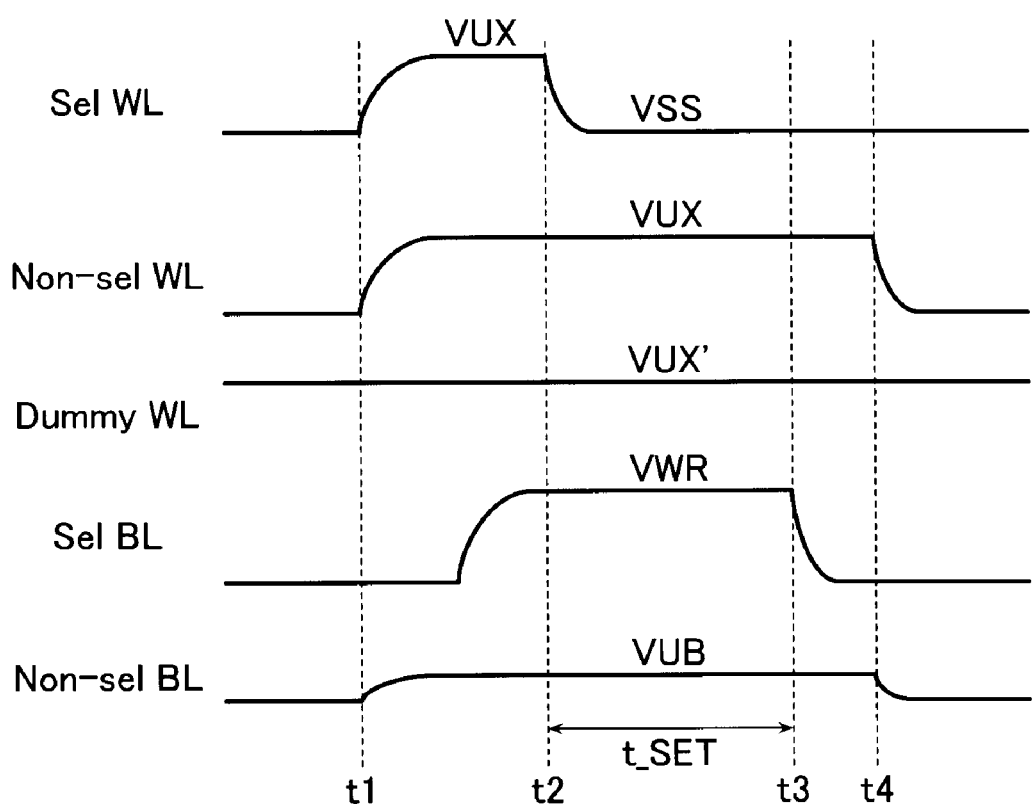
FIG. 6 shows operation waveform charts of the semiconductor memory device according to the first embodiment.

An operation of the semiconductor memory device according to the present embodiment will be explained with reference to FIG. 6. FIG. 6 shows waveform charts for explaining an operation of the semiconductor memory device according to the present embodiment. In an operation of the semiconductor memory device, one memory cell MC connected to a selected bit line BL and a selected word line WL is selected from a plurality of memory cells MC provided in the memory cell array MA, and a set operation or a reset operation is executed only on the selected memory cell MC. The following explanation on an operation of the semiconductor memory device will be given by employing a set operation of changing the selected memory cell MC from a high resistance state to a low resistance state as an example.

In an operation of the semiconductor memory device, a voltage VUX' is applied to the dummy word lines DummyWL and maintained as it is applied. The setting of the voltage value of the voltage VUX' will be described later. Then, at a timing t1, all the word lines WL are set to "H" state (voltage VUX). Also at the timing t1, a voltage VUB is applied to non-selected bit lines BL.

After this, a selected bit line BL is set to "H" state (writing voltage VWR) by a timing t2. Also, a selected word line WL connected to a selected memory cell MC is set to "L" state (voltage VSS) at the timing t2. When the selected word line WL becomes "L" state and the selected bit line BL becomes "H" state at the timing t2, a voltage necessary for the operation is applied to the selected memory cell MC. The writing voltage VWR is applied in a direction the selected bit line BL to the selected word line WL, i.e., in the forward bias direction of the diode of the selected memory cell MC. Hence, the resistance state of the selected memory cell MC transitions. Since a set operation is the case of the present embodiment, the selected memory cell MC transitions from a high resistance state to a low resistance state.

When it is detected at a timing t3 that the resistance state of the selected memory cell MC has transitioned, the application of the writing voltage VWR to the selected bit line BL is stopped. The time between the timing t2 and the timing t3 is a time t_SET necessary for setting the selected memory cell MC. Then, at a timing t4, the application of the voltages to the non-selected word lines WL and the non-selected bit lines BL is stopped, and the operation of the semiconductor memory device is completed.

The voltage VWR of the selected bit line BL and the voltage VSS of the selected word line WL during the time t_SET are set to voltages having such a potential difference VWR-VSS that is sufficient for executing a set operation on the memory cell MC. The voltage VUX of the non-selected word lines WL is set to a voltage having a potential difference VWR-VUX that does not erroneously effect a set operation on the memory cell MC. The voltage VUX may be equal to the voltage VWR or may be higher than the voltage VWR. The voltage VUX may also be lower than the voltage VWR unless the potential difference VWR-VUX erroneously effects a set operation on the memory cell MC. The voltage VUB of the non-selected bit lines BL is set as follows. Non-selected memory cells MC connected to the non-selected bit lines BL and the non-selected word lines WL are applied a voltage in the reverse bias direction of the diode Di. The voltage VUB of the non-selected bit lines BL is set such that a leakage current due to a potential difference VUB-VUX in the reverse bias direction of the non-selected memory cells MC is reduced.

The voltage value of the voltage VUX' of the dummy word lines DummyWL is set as follows. The voltage VUX' can be set to the same voltage value as that of the voltage VUX applied to the non-selected word lines WL. The voltage VUX' can also be set higher than a voltage value obtained by subtracting an on-voltage Von of the diode Di from the voltage VWR applied to the selected bit line BL. In other words, the voltage VUX' of the dummy word lines DummyWL can be set to a voltage value having a potential difference VWR-VUX' which is lower than the on-voltage Von of the diode Di. In this case, the voltage VUX' may be equal to the voltage VWR or higher than the voltage VWR.

[Effect of Semiconductor Memory Device According to First Embodiment]

In the semiconductor memory device according to the present embodiment, a word line layer has dummy word lines DummyWL in the bit line driver region. Therefore, the manufacturing conditions for stacking, polishing, etc. of a bit line layer to be formed on the word line layer can be uniformed between the memory cell array region and the bit line driver region. Hence, a bit line layer can be stacked with accuracy in the bit line driver region. Furthermore, as long as the manufacturing conditions for stacking, polishing, etc. will be uniformed to a certain extent, it is possible to set the line width of the dummy word lines DummyWL in the bit line driver region larger than that of the word lines WL, which makes it easier to manufacture the dummy word lines DummyWL.

With the layout in which the bit lines BL and the dummy word lines DummyWL intersect each other, the unnecessary memory cells MC formed at the intersections of the bit lines BL and the dummy word lines DummyWL might operate erroneously. However, in the semiconductor memory device according to the present embodiment, the voltage VUX' is applied to the dummy word lines DummyWL. When the voltage VUX' has the same voltage value as that of the voltage VUX applied to the non-selected word lines WL, the unnecessary memory cells MC at the intersections of the selected bit line BL and the dummy word lines DummyWL become non-selected state, and hence the set voltage is not applied thereto.

The voltage VUX' can also be set to a voltage higher than a value obtained by subtracting the on-voltage Von of the diode Di from the voltage VWR applied to the selected bit line BL. When the voltage value of the voltage VUX' is higher than the voltage value of the voltage VWR-Von, the diodes Di of the memory cells MC formed at the intersections of the bit lines BL and the dummy word lines DummyWL will not be turned on, and hence these memory cells MC will not operate erroneously.

When the voltage VUX' is set as described above, no erroneous operation will occur even though memory cells MC are formed at the intersections of the bit lines BL and the dummy word lines DummyWL.

Further, in the semiconductor memory device according to the present embodiment, when the voltage VUX' of the dummy word lines DummyWL is set to the same voltage value as the voltage VUX of the non-selected word line WL, the number of lines to apply the voltage VUX to is increased, because the voltage VUX is applied also to the dummy word lines DummyWL in addition to the non-selected word line WL. Therefore, a power supply for applying the voltage VUX can be powered up. Further, since the number of lines to which the voltage VUX is applied is increased, the resistance of the lines to which the voltage VUX is applied can be reduced. In this case, the resistance needs not be reduced by enlarging the line width of an M2 line through which the voltage VUX is transferred, which contributes to reducing the area necessary for the M2 line.

Second Embodiment

Configuration of Semiconductor Memory Device According to Second Embodiment

Next, a semiconductor memory device according to a second embodiment of the present invention will be explained. The semiconductor memory device according to the present embodiment is similar to the semiconductor memory device according to the above first embodiment in the configuration of the memory cell array MA, the memory block 1, the control circuits on the semiconductor substrate 2, etc.

Figure 7A:
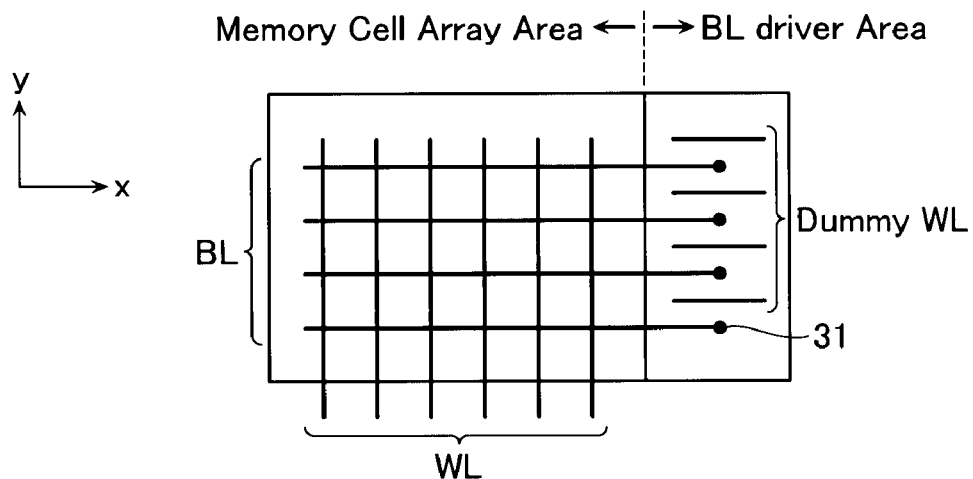
FIG. 7A is a layout diagram of wiring layers of a semiconductor memory device according to a second embodiment.
Figure 7B:
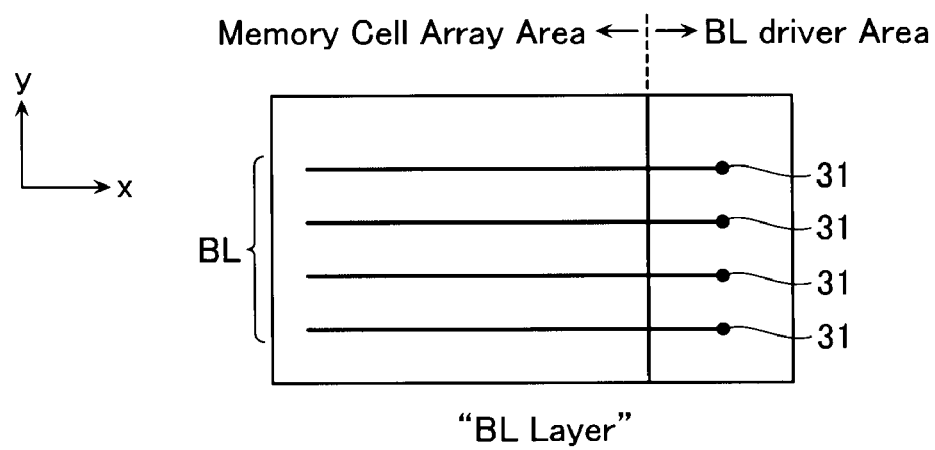
FIG. 7B is a layout diagram of a wiring layer of the semiconductor memory device according to the second embodiment.
Figure 7C:
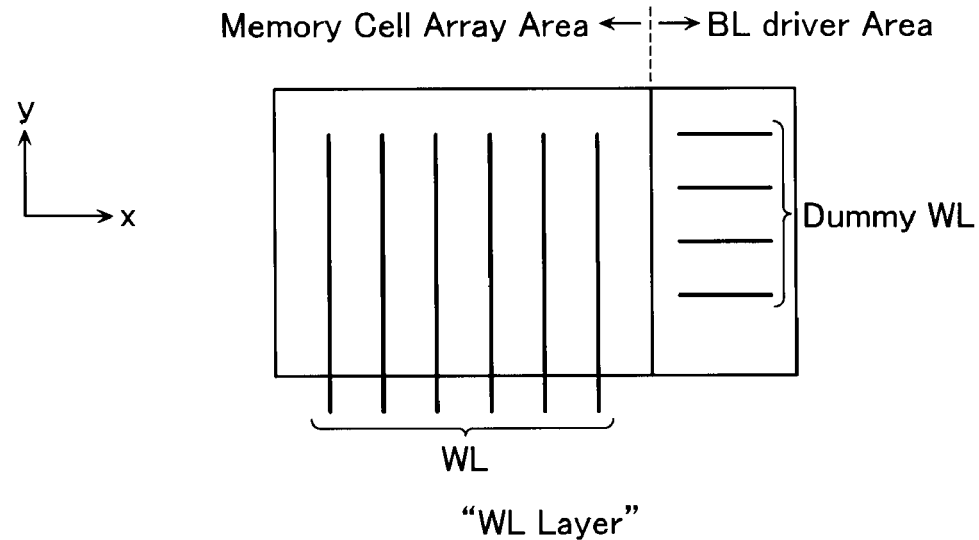
FIG. 7C is a layout diagram of a wiring layer of the semiconductor memory device according to the second embodiment.

FIG. 7A to FIG. 7C are wiring layout diagrams of a bit line layer and a word line layer of the semiconductor memory device according to the present embodiment. FIG. 7A shows the wiring layouts of a bit line layer and a word line layer in an overlaying manner. FIG. 7B and FIG. 7C show the wiring layouts of a bit line layer and a word line layer separately. FIG. 7A to FIG. 7C show, as top views, the wiring layouts in a region in which a memory cell array MA is formed by a bit line layer and a word line layer and a region above a bit line driver 25.

FIG. 7A is a wiring layout diagram of bit lines BL, word lines WL, and dummy word lines DummyWL formed in a memory cell array region and a bit line driver region. As described above, the semiconductor memory device according to the present embodiment has a cross-point type memory cell array MA in which bit lines BL and word lines WL intersect each other. Hence, in the memory cell array region, bit lines BL and word lines WL are provided to intersect each other.

The semiconductor memory device according to the present embodiment is different from the first embodiment in that the dummy word lines DummyWL are provided to extend in an x-direction parallel with the bit lines BL as shown in FIG. 7A and FIG. 7C. In the bit line driver region, a plurality of dummy word lines DummyWL are lined up in a y-direction such that they are parallel with one another. Further, as shown in FIG. 7A, the bit lines BL and the dummy word lines DummyWL are formed such that lines and spaces of the bit lines BL and those of the dummy word lines DummyWL are staggered. That is, the dummy word lines DummyWL in the word line layer are formed to align with the spaces between the bit lines BL in the bit line layer, and the bit lines BL in the bit line layer are formed to align with the spaces between the dummy word lines DummyWL in the word line layer.

In the semiconductor memory device according to the present embodiment, the bit lines BL and the dummy word lines Dummy WL are provided in parallel with each other in the bit line driver region as shown in FIG. 7A to FIG. 7C. In this case, the bit lines BL and the dummy word lines DummyWL do not intersect each other, and no unnecessary memory cells MC are formed.

[Operation of Semiconductor Memory Device According to Second Embodiment]

Figure 8:
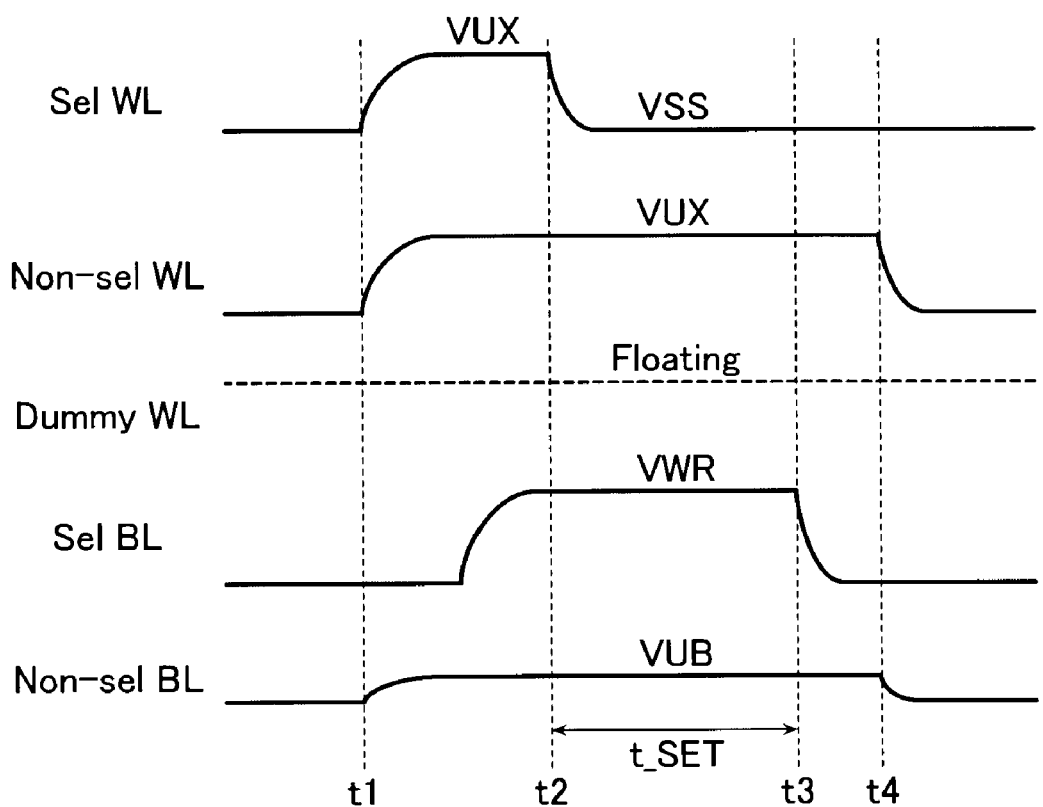
FIG. 8 shows operation waveform charts of the semiconductor memory device according to the second embodiment.

Next, an operation of the semiconductor memory device according to the present embodiment will be explained with reference to FIG. 8. FIG. 8 shows waveform charts for explaining an operation of the semiconductor memory device according to the present embodiment. The following explanation on the operation of the semiconductor memory device will also be given by employing a set operation of changing a selected memory cell MC from a high resistance state to a low resistance state as an example.

In the operation of the semiconductor memory device according to the present embodiment, the operations of the bit lines BL and the word lines WL from a timing t1 to a timing t4 are the same as in the first embodiment. Therefore, redundant explanation will not be given here. The semiconductor memory device according to the present embodiment is different from the operation of the first embodiment in bringing the dummy word lines WL into a floating state during the operation.

[Effect of Semiconductor Memory Device According to Second Embodiment]

In the semiconductor memory device according to the present embodiment, a word line layer has dummy word lines DummyWL in the bit line driver region. Therefore, the manufacturing conditions for stacking, polishing, etc. of a bit line layer to be formed on the word line layer can be uniformed between the memory cell array region and the bit line driver region. Hence, a bit line layer can be stacked with accuracy in the bit line driver region.

With a layout in which the bit lines BL and the dummy word lines DummyWL intersect each other, unnecessary memory cells MC formed at the intersections of the bit lines BL and the dummy word lines DummyWL might operate erroneously. However, in the semiconductor memory device according to the present embodiment, the dummy word lines DummyWL are provided in parallel with the bit lines BL. Hence, no memory cells MC are formed in the bit line driver region, and no erroneous operation will occur.

In the semiconductor memory device according to the present embodiment, the dummy word lines DummyWL are brought into a floating state during the operation. Hence, there is no need of providing a circuit for driving the dummy word lines DummyWL, which simplifies the circuit configuration on the semiconductor substrate 2.

As another example operation of the semiconductor memory device according to the second embodiment, it is possible to execute an operation similar to the operation of the first embodiment. That is, as shown in FIG. 6, it is possible to apply the voltage VWR and the voltage VSS to a selected bit line BL and a selected word line WL respectively, and apply the voltage VUX' to the dummy word lines DummyWL. Further, it is also possible to set the voltage value of the voltage VUX' in a manner similar to the first embodiment.

Though the embodiments of the present invention have been explained, the present invention is not limited to these embodiments, but various changes, additions, combinations, etc. are available within the scope of the spirit of the present invention. For example, though the above embodiments have been explained by employing a set operation as an example, the present semiconductor memory device can execute a reset operation and a read operation by controlling the voltage to be applied to the selected bit line.

It is possible to leave the unnecessary memory cells MC at the intersections of the bit lines BL and the dummy word lines DummyWL in the bit line driver region as they are set to a high resistance state. If the unnecessary memory cells MC at the intersections of the bit lines BL and the dummy word lines DummyWL are in a high resistance state, no current flows from the selected bit line BL to the dummy word lines DummyWL. Therefore, it is possible to prevent an erroneous operation of the semiconductor memory device. In this case, it is possible not to execute a forming operation on the unnecessary memory cells MC at the intersections of the bit lines BL and the dummy word lines DummyWL. The variable resistance element VR remains in a high resistance state constantly if it is left in its initial state as processed out from a resistance varying film. By being applied a certain forming voltage, the variable resistance element VR becomes able to change its resistance state. Unless the forming operation is executed on the unnecessary memory cells MC existing at the intersections of the bit lines BL and the dummy word lines DummyWL, the memory cells MC at these intersections will remain in a high resistance state constantly, and give no influence on the operation of the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a semiconductor substrate;
    a plurality of first lines stacked on the semiconductor substrate and parallel with one another;
    a plurality of second lines formed to intersect the plurality of first lines and parallel with one another;
    a memory cell array including memory cells provided at intersections of the first lines and the second lines and each including a variable resistance element and a selecting element connected in series to the variable resistance element;
    a first control circuit provided on a portion of the semiconductor substrate that is in a second region adjoining a first region located immediately under the memory cell array, and connected to ends of the first lines to select and drive the first lines;
    a second control circuit provided on a portion of the semiconductor substrate that is in the first region, and connected to ends of the second lines to select and drive the second lines; and
    dummy lines formed in a same wiring layer in which the second lines are formed, such that the dummy lines intersect the first lines in a region above the first control circuit,
    the first control circuit being configured to apply a first voltage to a selected one of the first lines such that a certain potential difference is applied to a selected memory cell provided at the intersection of the selected first line and a selected one of the second lines,
    the second control circuit being configured to apply a second voltage having a smaller voltage value than that of the first voltage to the selected second line, and applies, to the dummy lines, a third voltage having such a voltage value by which a potential difference to be applied to the memory cells provided at intersections of the selected first line and the dummy lines becomes lower than an on-voltage of the selecting element.

2. The semiconductor memory device according to claim 1, wherein the voltage value of the third voltage is equal to that of a voltage applied to non-selected ones of the second lines when the first line and the second line are selected.

3. The semiconductor memory device according to claim 1, wherein the first control circuit applies a fourth voltage having a voltage value smaller than that of the first voltage to non-selected ones of the first lines.

4. The semiconductor memory device according to claim 1, wherein the first lines and the second lines are shared by two memory cell arrays adjoining in a stacking direction,
    a plurality of first lines lining up in the stacking direction are connected to the first control circuit by different wiring contacts respectively, and
    a plurality of second lines lining up in the stacking direction are connected to the second control circuit by being connected to two wiring contacts alternately.

5. The semiconductor memory device according to claim 1, wherein the variable resistance element can assume either a high resistance state or a low resistance state, and
    the variable resistance elements of the memory cells formed at the intersections of the first lines and the dummy lines are set to the high resistance state.

6. The semiconductor memory device according to claim 1, wherein the variable resistance element can assume either a high resistance state or a low resistance state, and
    the variable resistance elements of the memory cells formed at the intersections of the first lines and the dummy lines are set to the high resistance state constantly.

7. The semiconductor memory device according to claim 1, wherein a plurality of first wiring layers in which the first lines are formed and a plurality of second wiring layers in which the second lines and the dummy lines are formed are stacked on the semiconductor substrate alternately.

8. The semiconductor memory device according to claim 1, wherein the dummy lines have a line width larger than that of the second lines.

9. A semiconductor memory device, comprising:
    a semiconductor substrate;
    a plurality of first lines stacked on the semiconductor substrate and parallel with one another;
    a plurality of second lines formed to intersect the plurality of first lines and parallel with one another;
    a memory cell array including memory cells provided at intersections of the first lines and the second lines and each including a variable resistance element and a selecting element connected in series to the variable resistance element;
    a first control circuit provided on a portion of the semiconductor substrate that is in a second region adjoining a first region located immediately under the memory cell array, and connected to ends of the first lines to select and drive the first lines;
    a second control circuit provided on a portion of the semiconductor substrate that is in the first region, and connected to ends of the second lines to select and drive the second lines; and
    dummy lines formed in a same wiring layer in which the second lines are formed, such that the dummy lines are parallel with the first lines in a region above the first control circuit.

10. The semiconductor memory device according to claim 9,
wherein the first control circuit and the second control circuit apply a first voltage to a selected one of the first lines and a second voltage having a voltage value smaller than that of the first voltage to a selected one of the second lines, such that a certain potential difference is applied to a selected memory cell provided at the intersection of the selected first line and the selected second line, and
the dummy lines are brought into a floating state when the first line and the second line are selected.

11. The semiconductor memory device according to claim 10,
wherein the first control circuit applies a fourth voltage having a voltage value smaller than that of the first voltage to non-selected ones of the first lines.

12. The semiconductor memory device according to claim 9,
wherein the first control circuit applies a first voltage to a selected one of the first lines such that a certain potential difference is applied to a selected memory cell provided at the intersection of the selected first line and a selected one of the second lines, and
the second control circuit applies a second voltage having a voltage value smaller than that of the first voltage to the selected second line, and applies, to the dummy lines, a third voltage having a voltage value equal to that of a voltage applied to non-selected ones of the second lines.

13. The semiconductor memory device according to claim 9,
wherein the first lines and the second lines are shared by two memory cell arrays adjoining in a stacking direction,
a plurality of first lines lining up in the stacking direction are connected to the first control circuit by different wiring contacts respectively, and
a plurality of second lines lining up in the stacking direction are connected to the second control circuit by being connected to two wiring contacts alternately.

14. The semiconductor memory device according to claim 9,
wherein the first lines and the dummy lines are formed in the second region such that the first lines and spaces between them and the dummy lines and spaces between them are staggered.

15. The semiconductor memory device according to claim 9,
wherein a plurality of first wiring layers in which the first lines are formed and a plurality of second wiring layers in which the second lines and the dummy lines are formed are stacked on the semiconductor substrate alternately.

16. The semiconductor memory device according to claim 9,
wherein the dummy lines have a line width larger than that of the second lines.

17. A semiconductor memory device, comprising:
a semiconductor substrate;
a plurality of first lines stacked on the semiconductor substrate and parallel with one another;
a plurality of second lines formed to intersect the plurality of first lines and parallel with one another;
a memory cell array including memory cells provided at intersections of the first lines and the second lines and each including a variable resistance element and a selecting element connected in series to the variable resistance element;
a first control circuit provided on a portion of the semiconductor substrate that is in a second region adjoining a first region located immediately under the memory cell array, and connected to ends of the first lines to select and drive the first lines;
a second control circuit provided on a portion of the semiconductor substrate that is in the first region, and connected to ends of the second lines to select and drive the second lines; and
dummy lines formed in a same wiring layer in which the second lines are formed, and formed in a region above the first control circuit.

18. The semiconductor memory device according to claim 17,
wherein the first lines and the second lines are shared by two memory cell arrays adjoining in a stacking direction,
a plurality of first lines lining up in the stacking direction are connected to the first control circuit by different wiring contacts respectively, and
a plurality of second lines lining up in the stacking direction are connected to the second control circuit by being connected to two wiring contacts alternately.

19. The semiconductor memory device according to claim 17,
wherein a plurality of first wiring layers in which the first lines are formed and a plurality of second wiring layers in which the second lines and the dummy lines are formed are stacked on the semiconductor substrate alternately.

20. The semiconductor memory device according to claim 17,
wherein the dummy lines have a line width larger than that of the second lines.

* * * * *